(12) United States Patent
Hashimoto

(10) Patent No.: US 6,703,854 B2
(45) Date of Patent: Mar. 9, 2004

(54) BURN-IN APPARATUS HAVING AVERAGE VOLTAGE CALCULATING CIRCUIT

(75) Inventor: Osamu Hashimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/225,306

(22) Filed: Aug. 22, 2002

(65) Prior Publication Data

US 2003/0062918 A1 Apr. 3, 2003

(30) Foreign Application Priority Data

Sep. 28, 2001 (JP) ........................ 2001-299604

(51) Int. Cl.[7] .................. G01R 31/02; G01R 31/28
(52) U.S. Cl. ........................ 324/760; 324/765
(58) Field of Search .................... 324/760, 765, 324/754, 758, 158.1; 438/14, 17

(56) References Cited

U.S. PATENT DOCUMENTS

| | | | | |
|---|---|---|---|---|
| 4,961,053 A | * | 10/1990 | Krug | 324/537 |
| 5,070,297 A | * | 12/1991 | Kwon et al. | 324/754 |
| 5,389,556 A | * | 2/1995 | Rostoker et al. | 438/17 |
| 5,397,997 A | * | 3/1995 | Tuckerman et al. | 324/754 |
| 5,701,666 A | * | 12/1997 | DeHaven et al. | 324/754 |
| 5,929,651 A | * | 7/1999 | Leas et al. | 324/765 |

FOREIGN PATENT DOCUMENTS

| | | |
|---|---|---|
| JP | 6-53299 | 2/1994 |
| JP | 9-205121 | 8/1997 |

* cited by examiner

Primary Examiner—Ernest Karlsen
(74) Attorney, Agent, or Firm—McDermott, Will & Emery

(57) ABSTRACT

A function test circuit inside a burn-in apparatus is mounted on a burn-in board and specifies a plurality of checked devices which operate normally. An average voltage calculating circuit calculates average voltage for test voltage applied to a plurality of checked devices specified on a mounting section. A voltage correction circuit receives the average voltage and outputs a control signal to control set voltage output from a device power supply generation circuit. Therefore, this burn-in apparatus can set the test voltage applied to the checked devices readily with high accuracy.

6 Claims, 4 Drawing Sheets

BURN-IN APPARATUS HAVING AVERAGE VOLTAGE CALCULATING CIRCUIT

BACKGROUND OF THE INVENTION

1. Field of the Invention

The present invention relates to a burn-in apparatus to perform a burn-in test for semiconductor integrated circuit devices.

2. Description of the Background Art

The burn-in test is performed in a checking process of semiconductor integrated circuit devices. An object of the burn-in test is to remove semiconductor integrated circuit devices of potential early defect from mass-produced semiconductor integrated circuit devices prior to shipping.

FIG. 4 is a schematic block diagram showing a configuration of a conventional burn-in apparatus.

Referring to FIG. 4, the burn-in apparatus 100 includes a body 10 and a burn-in board 11. Body 10 includes a device power supply generation circuit 12. Device power supply generation circuit 12 supplies set voltage Vs to burn-in board 11 during the burn-in test. Set voltage Vs will be described below. Burn-in board 11 mounts a plurality of semiconductor integrated circuit devices to be checked DUTs (devices under test) (a semiconductor integrated circuit device is referred to as a checked device hereinafter). Each of a plurality of checked devices DUTs is connected to device power supply generation circuit 12 via a protective resistance element R1.

If any of a plurality of checked devices DUTs were broken during the burn-in test, protective resistance element R1 prevents the broken checked devices DUTs from affecting voltage applied to other cheched devices DUTs.

Therefore, when burn-in apparatus 100 applies test voltage V to each of a plurality of checked devices DUTs, the set voltage Vs output from device power supply generation circuit 12 is set as follows, considering voltage drop due to protective resistance element R1;

$$Vs = V + iR;$$

wherein i is a value of current consumption of each checked device DUT and R is a resistance value of protective resistance element R1.

The value of current consumption of checked device i would be different, however, depending on types of semiconductor integrated circuit devices as checked devices DUTs, or on test conditions such as test rate during the burn-in test. As the result, set voltage Vs had to be set for every type of checked device and every test condition.

In conventional burn-in apparatus 100, set voltage Vs was set manually. Thus, the frequent settings of set voltage Vs made the work load heavier.

The value of current consumption of each checked device i would also be different because of variations in manufacturing of respective checked devices DUTs. Therefore, the work load became heavier to improve accuracy of test voltage V.

SUMMARY OF THE INVENTION

An object of the present invention is to provide a burn-in apparatus of which test voltage applied to checked devices can be set easily with high accuracy.

A burn-in apparatus according to the present invention includes a burn-in board, a device power supply generation circuit, an average voltage calculating circuit, and a voltage correction circuit. The burn-in board mounts a plurality of checked devices. The device power supply generation circuit supplies test voltage for a burn-in test to a plurality of checked devices mounted on the burn-in board. The average voltage calculating circuit measures the test voltage supplied to each checked device and outputs the average voltage. The voltage correction circuit outputs a control signal to control the device power supply generation circuit in accordance with the average voltage.

Thus the burn-in apparatus can set the test voltage in accordance with the average voltage calculated in the average voltage calculating circuit.

The voltage correction circuit preferably includes a comparator. The comparator receives the average voltage and a predetermined voltage and outputs the control signal.

Thus the burn-in apparatus compares the average voltage with the predetermined voltage and controls the device power supply generation circuit with this result. This can improve the accuracy of test voltage output from the device power supply generation circuit.

Furthermore, the burn-in apparatus preferably includes a sensing circuit which senses a plurality of checked devices mounted on the burn-in board, and the average voltage calculating circuit measures the test voltage supplied to each checked device sensed by the sensing circuit and outputs the average voltage.

Therefore the burn-in apparatus can measure the test voltage for the checked devices mounted on the burn-in board. Consequently, the accuracy of set test voltage is improved.

Furthermore, the sensing circuit preferably senses two or more operable checked devices among a plurality of checked devices.

Therefore the burn-in apparatus can sense the checked devices which are mounted on the burn-in board and are not broken by the test. Consequently, more accurate test voltage can be set.

It is preferred that the sensing circuit includes a function testing circuit to perform a function test for a plurality of checked devices, and the average voltage calculating circuit outputs average voltage in accordance with the result of the function test.

Therefore the burn-in apparatus can sense the checked devices mounted on the burn-in board by the function test.

The average voltage calculating circuit preferably measures the test voltage supplied to each of two or more checked devices among a plurality of checked devices and outputs the average voltage.

Therefore the burn-in apparatus can reduce the area required for wiring to measure the test voltage.

The burn-in apparatus according to the present invention measures for every checked device the test voltage applied to the checked devices and calculates the average voltage. The burn-in apparatus also corrects the test voltage using the calculated average voltage. Consequently, the burn-in apparatus can set the power supply voltage applied to the checked devices readily with high accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
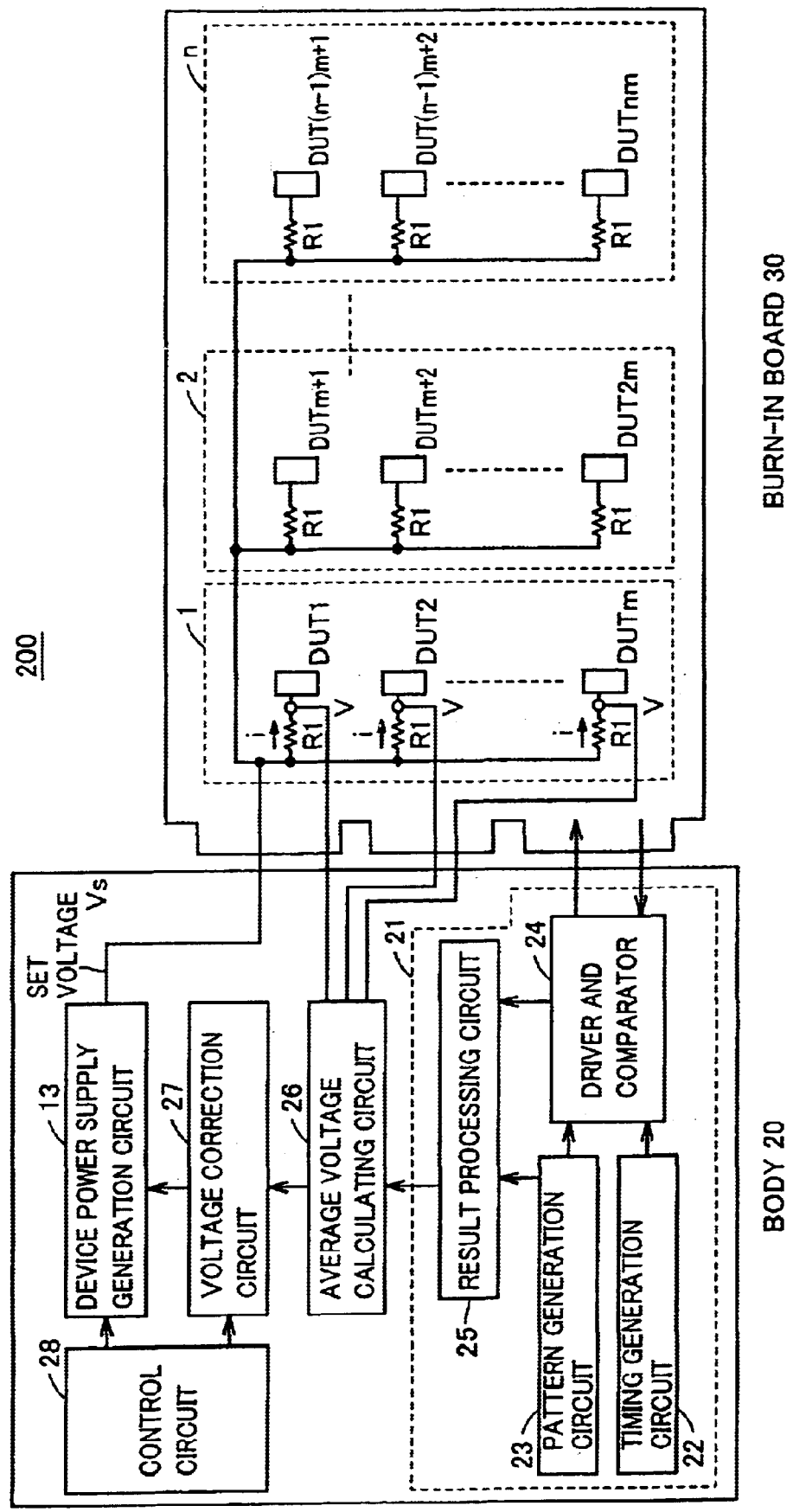
FIG. 1 is a schematic block diagram showing a configuration of a burn-in apparatus in an embodiment of the present invention.

Embodiments of the present invention will be described in detail with reference to the drawings. In the drawings, the same or corresponding parts have the same reference characters and the description will not be repeated.

FIG. 1 is a schematic block diagram showing a configuration of a burn-in apparatus in an embodiment of the present invention.

Referring to FIG. 1, the burn-in apparatus 200 includes a body 20 and a burn-in board 30 mounting a plurality of checked devices.

Burn-in board 30 includes mounting sections 1–n (n is a natural number) which mount a plurality of checked devices DUTs.

Mounting section 1 can mount m (m is a natural number) checked devices DUT1–DUTm. Each mounted checked device DUT is connected to a device power supply generation circuit 13 inside body 20 via a protective resistance element R1. Each of a plurality of checked devices DUT1–DUTm mounted on mounting section 1 also receives test pattern signal output from body 20. The test pattern signal will be described below. Mounting section 1 includes a plurality of sockets (not shown) to mount a plurality of checked devices DUT1–DUTm.

Each of a plurality of checked devices mounted on mounting section 1 is also connected to an average voltage calculating circuit 26 inside body 20. Average voltage calculating circuit 26 will be described below.

A plurality of checked devices mounted on mounting sections 2–n are not connected to average voltage calculating circuit 26. Other configurations of mounting sections 2–n are the same as mounting section 1 and the description will not be repeated here.

As the result, the number of checked devices mountable on burn-in board 30 is n×m.

Body 20 includes a device power supply generation circuit 13, a function test circuit 21, an average voltage calculating circuit 26, a voltage correction circuit 27, and a control circuit 28.

Function test circuit 21 performs function test for a plurality of checked devices mounted on burn-in board 30. Function test circuit 21 includes a timing generation circuit 22, a pattern generation circuit 23, a driver and comparator 24, and a test result processing circuit 25.

Timing generation circuit 22 outputs a reference signal which will be a base for the function test. The reference signal output from timing generation circuit 22 determines a cycle time of the function test.

Pattern generation circuit 23 outputs a preset test pattern signal in synchronization with the reference signal output from timing generation circuit 22.

Driver and comparator 24 outputs the test pattern signal to a plurality of checked devices DUTs mounted on burn-in board 30. It also receives the signal output from each checked device DUT which received the test pattern signal, and determines whether the each checked device operated normally or not, and then outputs the determination result to test result processing circuit 25. Each of a plurality of checked devices mounted on burn-in board 30 is specified, and the determination is done for each checked device.

Test result processing circuit 25 stores the determination results output from driver and comparator 24. Test result processing circuit 25 stores the determination results corresponding to a plurality of checked devices DUT1–DUTm.

Average voltage calculating circuit 26 receives the determination results stored in test result processing circuit 25, measures the test voltage V applied to a plurality of checked devices which were mounted on mounting section 1 and operated normally, and calculates the average voltage Vave of the measurement results. Average voltage calculating circuit 26 outputs the calculated average voltage Vave to voltage correction circuit 27.

Figure 2:
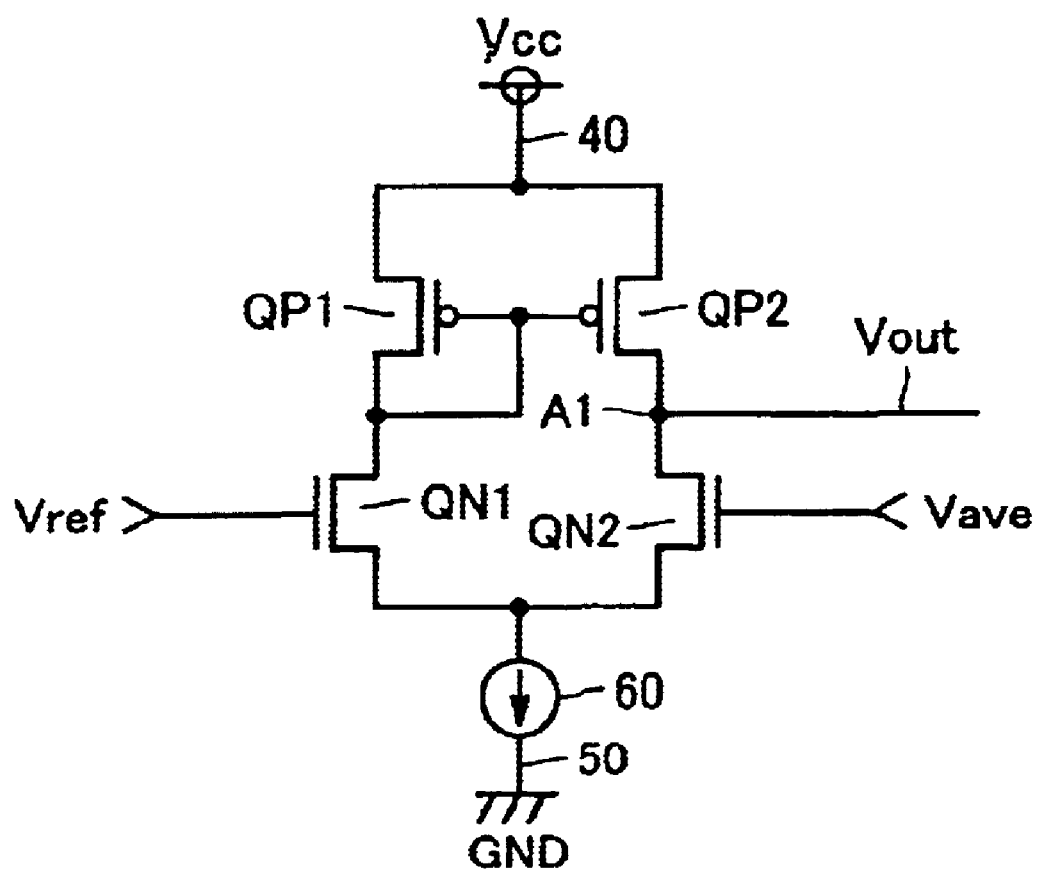
FIG. 2 is a circuit diagram showing a configuration of a voltage correction circuit in FIG. 1.

FIG. 2 is a circuit diagram showing a configuration of the voltage correction circuit in FIG. 1.

Referring to FIG. 2, voltage correction circuit 27 is configured with a comparator.

Referring to FIG. 2, voltage correction circuit 27 includes N-channel MOS transistors QN1, QN2 and P-channel MOS transistors QP1, QP2. Sources of transistors QP1 and QP2 are both connected to internal power node 40. Gates of transistors QP1 and QP2 are connected together and further, transistor QP1 is diode-connected.

Transistor QN1 has its drain connected to the drain of transistor QP1 and transistor QN2 has its drain connected to the drain of transistor QP2, respectively. Sources of transistors QN1 and QN2 are both connected to constant-current source 60. Reference voltage Vref is input to a gate of transistor QN1 and average voltage Vave is input to a gate of transistor QN2, respectively, and control signal Vout is output from output node A1 which is a connection point of transistor QP2 and transistor QN2.

Reference voltage Vref is output from control circuit 28 which will be described below.

Constant-current source 60 is connected to ground node 50.

Returning to FIG. 1, device power supply generation circuit 13 outputs set voltage Vs to supply test voltage V to a plurality of checked devices DUTs mounted on burn-in board 30.

In addition, device power supply generation circuit 13 receives the control signal Vout and controls a value of test voltage V to be output.

Control circuit 28 stores a plurality of different burn-in test programs. Control circuit 28 selects a burn-in test program and outputs to device power supply generation circuit 13 the information of test voltage V to be applied to checked devices DUTs during the burn-in test. It also outputs the reference voltage Vref corresponding to the selected burn-in test program to average voltage correction circuit 27.

An operation of burn-in apparatus 200 having the above-mentioned configuration will now be described.

Figure 3:
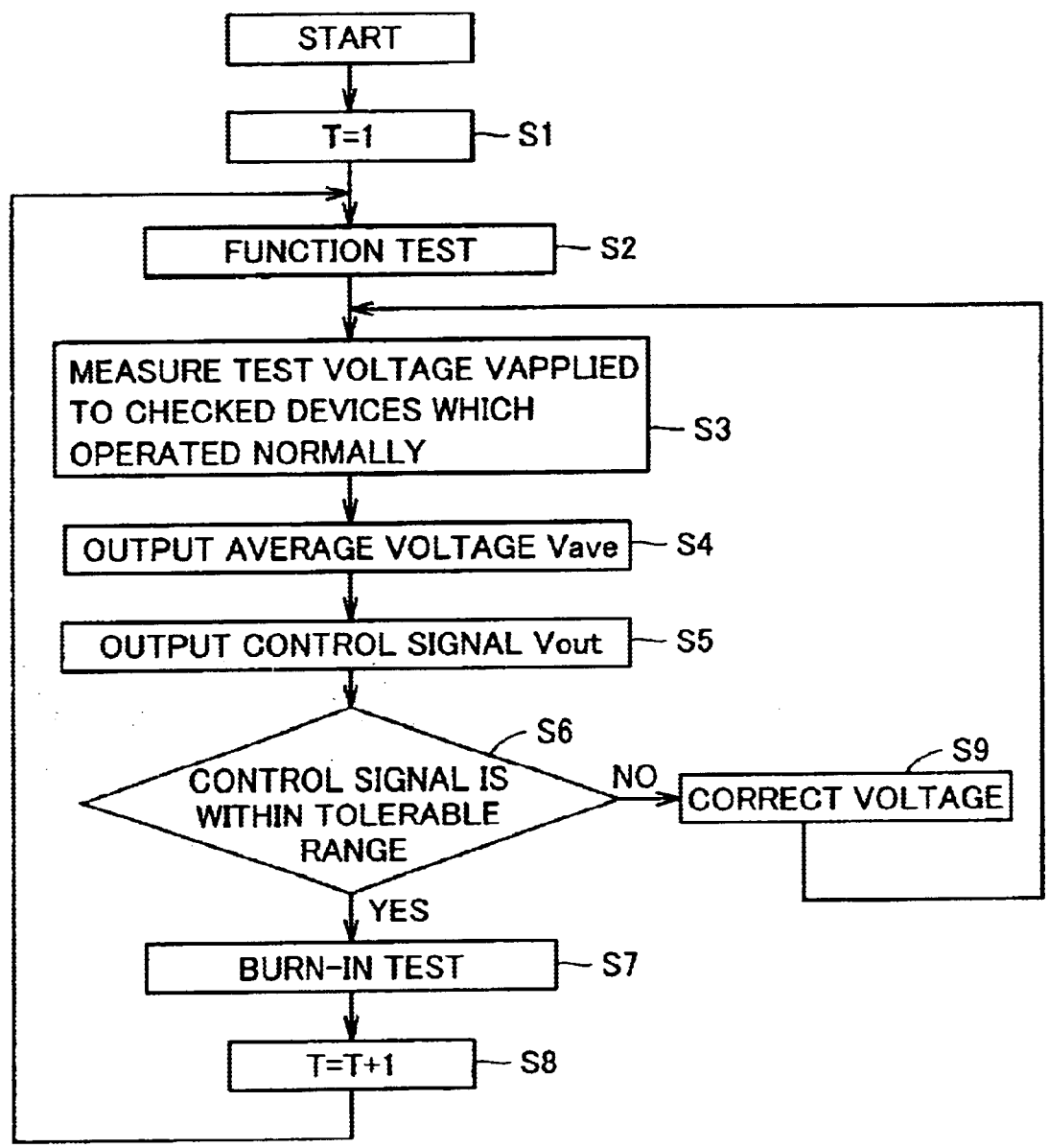
FIG. 3 is a flowchart showing an operation of the burn-in apparatus shown in FIG. 1.
Figure 4:
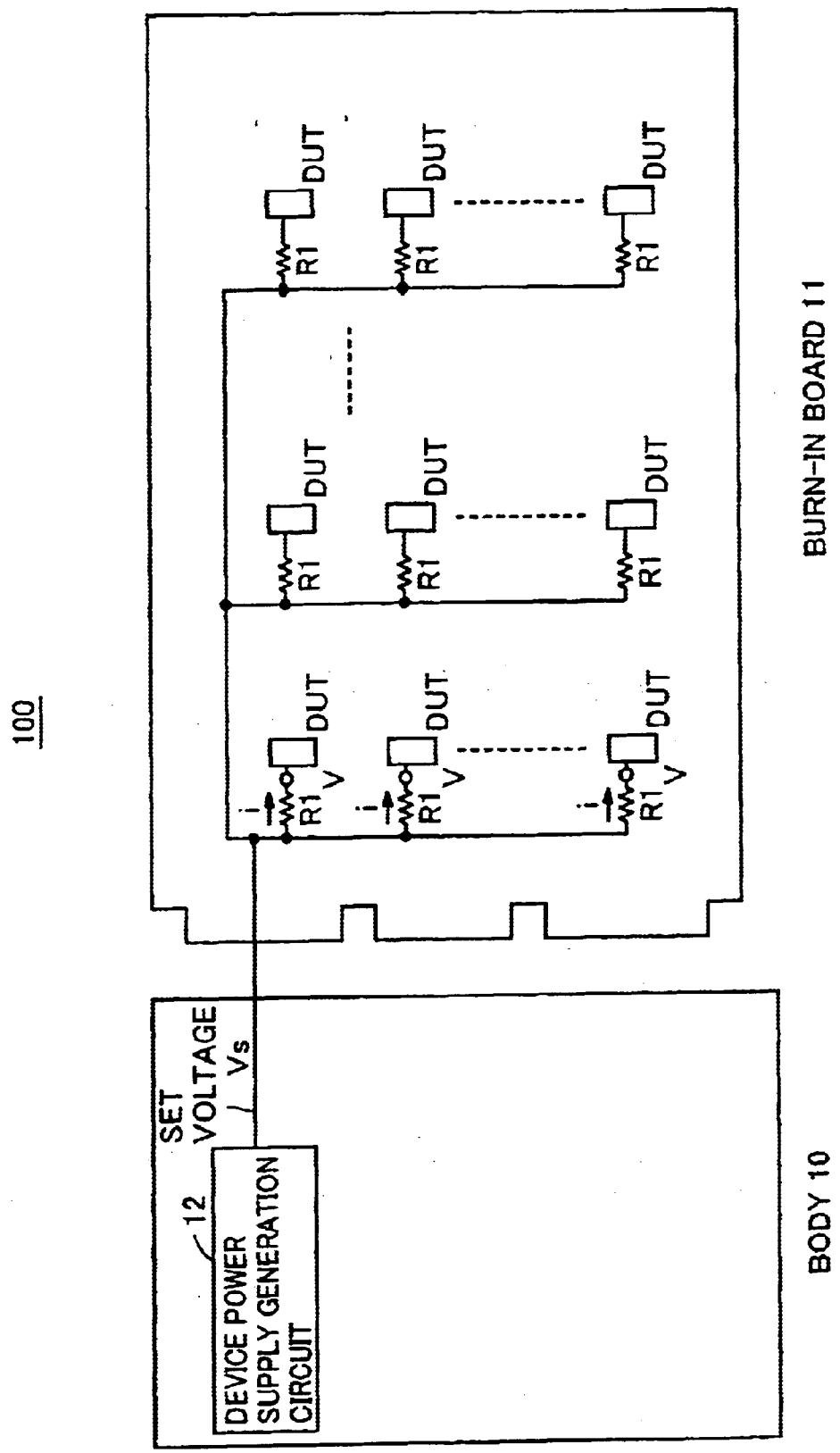
FIG. 4 is a schematic block diagram showing a configuration of a conventional burn-in apparatus.

FIG. 3 is a flowchart showing an operation of burn-in apparatus 200 shown in FIG. 1.

Referring to FIG. 3, control circuit 28 in burn-in apparatus 200 first selects a test of test NoT=1 (step S1). Herein, test NoT (T is a natural number) indicates a number for each of a plurality of different burn-in tests performed in burn-in apparatus 200. Burn-in apparatus 200 performs burn-in test of every test No for a plurality of checked devices DUTs mounted on burn-in board 30. Programs of multiple burn-in tests having test NoT are stored in a hard disk (not shown) inside control circuit 28 of FIG. 1.

In step S1, control circuit 28 instructs device power supply generation circuit 13 to supply test voltage V which will be applied to each checked device DUT for test No 1. Test voltage V is preset for every test No and the data of the test voltage V for each test No is prestored in hard disk inside control circuit 28.

Burn-in apparatus 200 then performs a function test for a plurality of checked devices DUTs on burn-in board 30 (step S2). The function test is, for example, a march pattern test.

At this time, function test circuit 21 outputs test pattern signal. Furthermore, it uses signal output from each checked device DUT that has received the test pattern signal to determine whether each checked device operated normally or not, and stores the results in test result processing circuit 25 inside function test circuit 21. With the operation of step S2, burn-in apparatus 200 can specify the checked device DUT which is mounted on burn-in board 30 and is not broken.

Then, device power supply generation circuit 13 outputs set voltage Vs to apply test voltage V to each checked device DUT. Average voltage calculating circuit 26 inside burn-in apparatus 200 measures the test voltage V actually applied to checked devices DUTs using the determination results stored in test result processing circuit 25 (step S3).

More specifically, average voltage calculating circuit 26 obtains determination results of a plurality of checked devices DUT1-DUTm on mounting section 1 from test result processing circuit 25. From the obtained determination results, average voltage calculating circuit 26 specifies a plurality of checked devices DUTs which are mounted on mounting section 1 and operated normally. Then, average voltage calculating circuit 26 measures test voltage V applied to a plurality of checked devices DUTs which are specified.

Thereafter, average voltage calculating circuit 26 calculates average voltage Vave of test voltage measured in step S3 (step S4). Average voltage calculating circuit 26 outputs the calculated average voltage Vave to voltage correction circuit 27.

Voltage correction circuit 27 receives the average voltage Vave and outputs the control signal Vout (step S5). Reference voltage Vref is output from control circuit 28 and the value differs for every test No. Voltage correction circuit 27 outputs control signal Vout to device power supply generation circuit 13.

Device power supply generation circuit 13 then determines whether the voltage value of received control signal Vout is within tolerance or not (step S6). Tolerable range of control signal Vout is prestored in device power supply generation circuit 13.

If the determination result of device power supply generation circuit 13 indicates that the received control signal Vout is within tolerance, burn-in apparatus 200 will perform burn-in test of test No 1 (step S7).

After the test is completed, control circuit 28 selects test NoT=2 (step S8), and burn-in apparatus 200 restarts the operation from step S2.

On the other hand, if device power supply generation circuit 13 determines that the received control signal Vout is out of the tolerance in step S6, device power supply generation circuit 13 corrects set voltage Vs corresponding to control signal Vout (step S9). Correction amount of set voltage Vs corresponding to control signal Vout is prestored in device power supply generation circuit 13, and device power supply generation circuit 13 corrects set voltage Vs based on the correction amount determined with received control signal Vout.

After the correction of set voltage Vs in step S9, the operation of burn-in apparatus 200 returns to step S3. Correction operation of step S9 will be repeated until the voltage level of control signal Vout output from voltage correction circuit 27 is included in the tolerance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A burn-in apparatus, comprising:
   a burn-in board on which a plurality of checked devices are mountable;
   a device power supply generation circuit supplying test voltage for burn-in test to said plurality of checked devices mounted on said burn-in board;
   an average voltage calculating circuit measuring said test voltage supplied to each of said plurality of checked devices and outputting an average voltage; and
   a voltage correction circuit outputting control signal to control said device power supply generation circuit in response to said average voltage.

2. The burn-in apparatus according to claim 1, wherein said voltage correction circuit includes a comparator receiving said average voltage and predetermined voltage and outputting said control signal.

3. The burn-in apparatus according to claim 1, further comprising a sensing circuit sensing said plurality of checked devices mounted on said burn-in board; wherein
   said average voltage calculating circuit measures said test voltage supplied to each of said plurality of checked devices sensed by said sensing circuit and outputs said average voltage.

4. The burn-in apparatus according to claim 3, wherein said sensing circuit further senses two or more operable checked devices among said plurality of checked devices.

5. The burn-in apparatus according to claim 4, wherein said sensing circuit includes a function testing circuit performing a function test for said plurality of checked devices; and
   said average voltage calculating circuit outputs said average voltage in response to the result of said function test.

6. The burn-in apparatus according to claim 1, wherein said average voltage calculating circuit measures said test voltage supplied to each of two or more checked devices among said plurality of checked devices and outputs said average voltage.

* * * * *